United States Patent
Andriessen (10) Patent No.: US 7,468,146 B2
(45) Date of Patent: Dec. 23, 2008

(54) METAL CHALCOGENIDE COMPOSITE NANO-PARTICLES AND LAYERS THEREWITH

(75) Inventor: Hieronymus Andriessen, Beerse (BE)

(73) Assignee: Agfa-Gevaert, Mortsel (BE)

(*) Notice: Subject to any disclaimer, the term of this patent is extended or adjusted under 35 U.S.C. 154(b) by 878 days.

(21) Appl. No.: 10/659,926

(22) Filed: Sep. 11, 2003

(65) Prior Publication Data

US 2004/0103936 A1 Jun. 3, 2004

Related U.S. Application Data (60) Provisional application No. 60/411,734, filed on Sep. 18, 2002.

(30) Foreign Application Priority Data

Sep. 12, 2002 (WO) .................. PCT/EP02/10268

(51) Int. Cl.
*C09K 11/56* (2006.01)
*C09K 11/88* (2006.01)
*H01L 31/0296* (2006.01)
*H01L 31/0336* (2006.01)
*H01L 31/101* (2006.01)
*C01B 19/00* (2006.01)
*C01G 9/08* (2006.01)
*C01G 11/02* (2006.01)

(52) U.S. Cl. .............. 252/301.4 R; 252/301.4 S; 252/301.6 R; 252/301.6 S; 252/62.3 ZT; 423/508; 423/509; 423/561.1; 423/562; 423/566.1; 977/826; 977/824; 977/783; 977/778; 977/834; 977/948; 136/264; 136/265; 136/260; 136/243; 438/95

(58) Field of Classification Search ............... 423/508, 423/509, 561.1, 562, 566.1; 252/301.4 R, 252/301.4 S, 301.6 R, 301.6 S; 977/826, 977/824, 783, 778, 834, 948; 438/95; 136/264, 136/265, 260, 243
See application file for complete search history.

(56) References Cited

U.S. PATENT DOCUMENTS 4,927,721 A 5/1990 Gratzel et al.

(Continued)

FOREIGN PATENT DOCUMENTS

EP 1 231 250 A1 8/2002

(Continued)

OTHER PUBLICATIONS

Gugliemi et al, "Preparation and Characterization of HgxCd1-xS and PbxCd1-xS Quantum Dots and Doped Thin Films", Jour. Sol-Gel Sci and Tech, 11, 1'998, pp. 229-240.*

(Continued)

*Primary Examiner*—C. Melissa Koslow
(74) *Attorney, Agent, or Firm*—Leydig Voit & Mayer, Ltd.

(57) ABSTRACT

A metal chalcogenide composite nano-particle comprising a metal capable of forming p-type semiconducting chalcogenide nano-particles and a metal capable of forming n-type semiconducting chalcogenide nano-particles, wherein at least one of the metal chalcogenides has a band-gap between 1.0 and 2.9 eV and the concentration of the metal capable of forming p-type semiconducting chalcogenide nano-particles is at least 5 atomic percent of the metal and is less than 50 atomic percent of the metal; a dispersion thereof; a layer comprising the nano-particles; and a photovoltaic device comprising the layer.

27 Claims, 1 Drawing Sheet

U.S. PATENT DOCUMENTS

| | | | |
|---|---|---|---|
| 5,341,001 | A | 8/1994 | Hayashi et al. |
| 5,350,644 | A | 9/1994 | Graetzel et al. |
| 6,602,731 | B2 * | 8/2003 | Andriessen .................. 438/29 |
| 7,008,559 | B2 * | 3/2006 | Chen ..................... 252/301.6 S |

FOREIGN PATENT DOCUMENTS

| | | |
|---|---|---|
| GB | 1119372 | 7/1968 |
| JP | 5-504023 W | 6/1993 |

OTHER PUBLICATIONS

Zbinden et al, "Zinc-iron sulphide mineralization in tubes of hydrothermal vent worms", Eur. J. Mineral., 13, 1001, pp. 653-658.*

Search Report for PCT/EP02/10268 (Jun. 13, 2003).

INSPEC Database Accession No. 5715390 (Abstract of Artemyev et al., "Sensitivity of nanocrystalline copper sulfide/cadmium sulfide heterojunction in near-IR region," *Proceedings of Optoelectronic Materials: Ordering, Composition Modulation, and Self-Assembled Structures*, 181-185 (Boston, Massachusetts, USA, Nov. 28-30, 1995).

Huynh et al., "Hybrid Nanorod-Polymer Solar Cells" *Science*, 295: 2425-2427 (Mar. 29, 2002).

Kolthoff et al., "The Promoting Action of Copper Sulfide on the Speed of Precipitation of Zinc Sulfide (The So-called Coprecipitation of Zinc with Copper Sulfide)," *J. of Physical Chem.*, 36: 549-566 (1932).

O'Regan et al., "A low-cost, high-efficiency solar cell based on dye-sensitized colloidal $TiO_2$ films," *Nature*, 353: 737-740 (Oct. 24, 1991).

Reijnen et al., "Nanoporooous $TiO_2/Cu_{1-e}S$ heterojunctions for solar energy conversion," *Materials Science and Engineering C: Biomimetic and Supramolecular Systems*, 19: 311-314 (2002).

Shaheen et al., "2.5% efficient organic plastic solar cells," *Applied Physics Letters*, 78 (6): 841-843 (Feb. 5, 2001).

Tsamouras et al., "Preparation and Characterization of Cu(II), Zn(II) Sulfides Obtained by Spontaneous Precipitation in Electrolyte Solutions," *Langmuir*, 14: 5298-5304 (1998).

Tsamouras et al., "Properties of Cu(II) and Ni(II) Sulfides Prepared by Coprecipitation in Aqueous Solution," *Langmuir*, 15: 7940-7946 (1999).

Vlasenko et al., "On the Mechanism of DC Electroluminescence in $pCu_xS$-$nZnS$:Mn, Cu, Cl Film Structures," *Physica Status Solidi*, 26 (1): K77-K81 (Mar. 1, 1968).

Munters et al., "A comparison between state-of-the-art 'gilch' and 'sulphinyl' synthesized MDMO-PPV / PCBM bulk hetero-junction solar cells," *Thin Solid Films*, 403-404: 247-251 (2002).

* cited by examiner

Figure 1:

METAL CHALCOGENIDE COMPOSITE NANO-PARTICLES AND LAYERS THEREWITH

This application claims the benefit of U.S. Provisional Application No. 60/411,734 filed Sep. 18, 2002, which is incorporated by reference. In addition, this application claims the benefit of International Application No. PCT/EP 02/10268 filed Sep. 12, 2002, which is also incorporated by reference.

FIELD OF THE INVENTION

The present invention relates to metal chalcogenide composite nano-particles, layers comprising same and photovoltaic devices comprising the layers.

BACKGROUND OF THE INVENTION

A photovoltaic (PV) process basically consists of four steps: (1) absorption of a photon, (2) charge separation, (3) charge transport and (4) charge collection. Thin-film technologies with low cost potential are compared with crystalline silicon in the table below, which also includes the compounds used for each step of the above-mentioned photovoltaic process.

Since the beginning of the 80's, much research effort has been devoted to so-called quantum dots or inorganic nano-particles. Several photovoltaic devices had been reported before Huyn et al. disclosed a energy conversion efficiency of 1.7% in Science, volume 295, pages 2425-2427, using a blend of nano-rods of CdSe (as light absorber and n-type semiconducting material) and poly-3(hexylthiophene) (as light absorber and p-type semiconducting material). Although the photovoltaic blend can be applied in a single coating step, resulting in a layer thickness of 110 nm, the blend still contains an organic semiconducting material, and hence stability could still be a problem.

The so-called dye sensitized solar cell reported in 1991 by Graetzel in Nature, volume 353, pages 737-740, and disclosed in U.S. Pat. No. 4,927,721, U.S. Pat. No. 5,350,644 and JP-A 05-504023, is also a type of bulk heterojunction photovoltaic cell in which $TiO_2$ nano-particles are used as the n-type semi-conductor. However, the construction of these devices is far more complicated than a one-step coating of a photovoltaic layer.

A need therefore exists for novel thin film photovoltaic materials.

GB 1119372 discloses a photovoltaic device based on $Cu_2S$-powder which is pressed at 700-1000° C. and 100-1000 $kg/cm^2$ to form a plate 2.0 $cm^2$ in area and 3.0 mm thick. A CdS plate is prepared by pressing CdS powder into pellets,

|  | Light absorber | Charge separation (n/p-junction) | Charge transport P = p-type SC* N = n-type SC* | Charge collection C = cathode A = anode |
|---|---|---|---|---|
| Crystalline Si | Si | Si:P(n-type)/ p-type Si | P = p-type Si N = Si:P | C: Al A: Metal grid |
| Thin film Si | Si | Si:P(n-type)/ p-type Si | P = p-type Si N = Si:P | C: Al A: ITO, ZnO: Al, $SnO_2$: F |
| Amorphous Si | Si | Si:P(n-type)/ intrinsic Si/ p-type Si | P = p-type Si N = Si:P | C: Al A: ITO, ZnO: Al, $SnO_2$: F |
| Cu(In, Ga) - $(Se, S)_2$ | Cu(In,Ga) $(Se, S)_2$ | $CuIn(Se, S)_2$ or $CdS/CuGa(Se, S)_2$ | N: $CuIn(Se, S)_2$ or CdS P: $CuGa(Se, S)_2$ | C: Mo A: ITO, ZnO: Al, $SnO_2$: F |
| CdTe | CdS (& CdTe) | CdS/CdTe | N: CdS P: CdTe | C: Al, Cu A: ITO, ZnO: Al, $SnO_2$: F |
| Dye sensitized | Ru-dye, Organic dye | $TiO_2$/dye | N: $TiO_2$ P: $I^-/I_3^-$, CuI, Spiro-OMeTAD | C: Al, ITO, ZnO: Al, $SnO_2$: F A: ITO, ZnO: Al, $SnO_2$: F |
| Organic | (MEH)PPV | $C_{60}$/(MEH)PPV | N: $C_{60}$ P: (MEH)PPV | C: Al A: ITO |

*SC = semiconductor

Although all the above mentioned concepts are categorized as thin film photovoltaic devices, only the pure organic technology uses really thin films for the photoactive layer (<200 nm). The other technologies use film thicknesses of the photoactive layer between 1 and 20-30 μm. Such thick films require high temperature manufacturing steps to realize sufficient charge mobilities in the respective n-and p-type semiconducting charge transporting materials. Otherwise, no charges could be collected at the electrodes. Although charge mobilities are low in organic photovoltaic technology, charges can be successfully collected due to the very thin photoactive layer (<200 nm).

Although energy conversion efficiencies of 2.5% and 2.9% were reported in 2001 by Shaheen et al. in Applied Physics Letters, volume 78, pages 841-843; and by Munters et al. in the Proceedings of E-MRS Spring meeting, the main drawback for organic photovoltaic devices remains the stability of the device.

sintering at 800° C. in a nitrogen atmosphere, and grinding to a powder. The product is then pressed as above to form a plate 0.75 $cm^2$ in area and 0.35 mm thick. After etching and polishing the surfaces, both disks were placed in an alloy die, enveloped in powder graphite, and pressed at 400° C. and 200 $kg/cm^2$. This photovoltaic device can be described as a two-dimensional p-n heterojunction device. ZnSe or ZnS could be also used instead of CdS, but with reduced light absorption due to the larger bandgaps.

In 2002 Reijnen et al.in Biomimetic and Supramolecular Systems, volume C19(1-2), pages 311-314, reported the feasibility of a photovoltaic device with $TiO_2$ as n-type semiconductor and vacuum deposited $Cu_{1.8}S$ as a p-type semiconductor and absorber.

In 1968, Vlasko et al. reported in Phys. Stat. Sol., volume 26, pages K77-80, investigated the possible role of p-n heterojunction formation in $Cu_xS$ and ZnS evaporated layer structures exhibiting electroluminescence.

Coprecipitation of copper sulphide and zinc sulphide was reported in 1932 by Kolthoff et al. in Journal of Physical Chemistry, volume 36, pages 549-566. In 1998, Tsamouras et al. in Langmuir, volume 14, pages 5298-5304, described the preparation and characterization of mixed Cu(II), Zn(II) sulphides which they described by the stoichiometric formula $Cu_xZn_{1-x}S$ obtained by spontaneous precipitation in electrolyte solutions upon mixing copper and zinc nitrate solutions with an ammonium sulphide solution at a pH of 2.5 with small quantities of hydrazine sulphate being added to accelerate sulphide precipitation. XRD-spectra showed reflections of both ZnS and CuS, the precipitates mainly consisting of the two sulphides together with nonstoichiometric sulphides of Cu(II) and Zn(II). The spherullitic particles obtained upon increasing zinc content had a mean particle size of 0.5 to 1 μm. The precipitated copper(II) sulphide exhibited metallic conductor behaviour over the temperature range investigated. The precipitates behaved as n-type semiconductors. No photovoltaic evaluations were reported.

In 1999, Tsamouras et al. in Langmuir, volume 15, pages 7940-7946, reported the properties of a series of $Cu_xNi_{1-x}S$ powders prepared by spontaneous coprecipitation in aqueous solutions by rapidly mixing copper(II) and nickel(II) chloride solutions with a ammonium sulphide solution at a pH of 2.5 with hydrazine sulphate being finally added at a concentration equal to the final sulphide concentration in the solution to accelerate sulphide formation. Powder XRD spectra included new peaks which could not be attributed to copper(II) sulphide, nickel(II) sulphide or other known species suggesting the formation of new intermediate phases. The powders exhibited broad particle size distributions with mean particle sizes of 5 to 11 μm. Current potential curves in electrochemical cells with $Cu_xNi_{1-x}S$/Au and Pt electrodes with 0.01 M $Ce^{3+}/Ce^{4+}$ as electrolyte under constant tungsten-halide lamp illumination (100 mW/cm$^2$) gave values for the open circuit potential as high as 0.868 V with 0.119 mA for the photocurrent and 0.58 for the field factor.

EP-A 1 231 250 discloses a method for manufacturing a thin film inorganic light emitting diode device, said method comprising following steps: (1) preparing a nano-particle dispersion comprising together ZnS doped with a luminescence centre (n-type semiconductor) and $Cu_xS$ (p-type semiconductor) by precipitation from appropriate aqueous solutions of the respective ions, or, (1') preparing a first separate nano-particle dispersion of ZnS doped with a luminescent centre (n-type semiconductor) and a second separate nano-particle dispersion of $Cu_xS$ (p-type semiconductor), both by precipitation from appropriate aqueous solutions of the respective ions, (2) washing the dispersion prepared according to (1) or both dispersions according to (1') to remove non-precipitated ions, (3) coating onto a first conductive electrode the dispersion resulting from steps (1) and (2), or a mixture of the dispersions resulting from steps (1') and (2) in one and the same layer, or the separate dispersions resulting from steps (1') and (20 in two separate layers, (4) applying on top of said coated layer(s) resulting from step (3) a second conductive electrode, with the proviso that at least one of said first and second electrodes is transparent.

ASPECTS OF THE INVENTION

It is therefore an aspect of the present invention to provide novel thin film photovoltaic materials.

It is another aspect of the present invention to provide a process for preparing novel thin film photovoltaic materials.

Further aspects and advantages of the invention will become apparent from the description hereinafter.

SUMMARY OF THE INVENTION

Were n-type and p-type semiconducting materials to be used to construct a bulk heterojunction photovoltaic device with a layer thickness of 50-200 nm, nano-sized particles would be necessary. However, low bandgap semi-conductors would be necessary to obtain the necessary absorption, but these behave more or less as conductors, which is undesirable in photovoltaic cells. Despite this drawback, it has been surprisingly found that metal chalcogenide composite nano-particles with a n-type semiconducting metal chalcogenide phase and a p-type semiconducting metal chalcogenide phase, which at concentrations of the p-type semiconducting phase of 1 or 2 mole % exhibit electroluminescence, exhibit a photovoltaic effect at p-type semiconducting phases of 5 to 50 mole %. This effect can be increased by incorporating a binder and a spectral sensitizer such as a metal chalcogenide spectral sensitizer either by admixture or by incorporation in the metal chalcogenide composite nano-particle itself.

Aspects of the present invention are realized by a metal chalcogenide composite nano-particle comprising a metal capable of forming p-type semiconducting chalcogenide nano-particles and a metal capable of forming n-type semiconducting chalcogenide nano-particles, wherein at least one of the metal chalcogenides has a band-gap between 1.0 and 2.9 eV and the concentration of the metal capable of forming p-type semiconducting chalcogenide nano-particles is at least 5 atomic percent of the metal and is less than 50 atomic percent of the metal.

Aspects of the present invention are also realized by a dispersion comprising the above-mentioned metal chalcogenide composite nano-particle.

Aspects of the present invention are also realized by a process for preparing the above-mentioned dispersion comprising the steps of preparing a composite metal chalcogenide nano-particle containing an n-type semiconducting chalcogenide and a p-type semiconducting p-type semiconducting chalcogenide, wherein at least one of the metal chalcogenides has a band-gap between 1.5 and 2.9 eV.

Aspects of the present invention are also realized by a layer comprising the above-mentioned metal chalcogenide composite nano-particles.

Aspects of the present invention are also realized by a photovoltaic device comprising the above-mentioned layer.

Aspects of the present invention are also provided by the use of the above-mentioned metal chalcogenide composite nano-particle in a photovoltaic device.

Preferred embodiments are disclosed in the dependent claims.

DETAILED DESCRIPTION OF THE INVENTION

DEFINITIONS

The term metal chalcogenide composite nano-particle refers to the primary particle formed in the preparation process and not to agglomerates thereof.

The term metal chalcogenide means a binary compound containing a chalcogen and a more electropositive element or radical. A chalcogen is an element from group IV of the periodic table including oxygen, sulphur, selenium, tellurium and polonium.

The term nano-particle for the purposes of the present invention means a number mean particle size of less than 50 nm.

The term "support" means a "self-supporting material" so as to distinguish it from a "layer" which may be coated on a support, but which is itself not self-supporting. It also includes any treatment necessary for, or layer applied to aid, adhesion to the support.

The term continuous layer refers to a layer in a single plane covering the whole area of the support and not necessarily in direct contact with the support.

The term non-continuous layer refers to a layer in a single plane not covering the whole area of the support and not necessarily in direct contact with the support.

The term coating is used as a generic term including all means of applying a layer including all techniques for producing continuous layers, such as curtain coating, doctor-blade coating etc., and all techniques for producing non-continuous layers such as screen printing, ink jet printing, flexographic printing, and techniques for producing continuous layers.

Metal Chalcogenide Composite Nano-Particles

Aspects of the present invention are realized with a metal chalcogenide composite nano-particle comprising a metal capable of forming p-type semiconducting chalcogenide nano-particles and a metal capable of forming n-type semiconducting chalcogenide nano-particles, wherein at least one of the metal chalcogenides has a band-gap between 1.5 and 2.9 eV and the concentration of the metal capable of forming p-type semiconducting chalcogenide nano-particles is at least 5 atomic percent of the metal and is less than 50 atomic percent of the metal.

According to a first embodiment of the metal chalcogenide composite nano-particle, according to the present invention, the metal chalcogenide composite particle comprises a p-type semiconducting metal chalcogenide phase and a n-type semiconducting chalcogenide phase, at least one of the metal chalcogenides has a band-gap between 1.0 and 2.9 eV and the concentration of the p-type semiconducting metal chalcogenide in the metal chalcogenide composite nano-particle is at least 5 mole percent and is less than 50 mole percent.

According to a second embodiment of the metal chalcogenide composite nano-particle, according to the present invention, the metal chalcogenide composite particle is a coprecipitated particle, being a particle prepared by a coprecipitation technique.

According to a third embodiment of the metal chalcogenide composite nano-particle, according to the present invention, the metal chalcogenide composite particle is a metal sulphide composite particle.

According to a fourth embodiment of the metal chalcogenide composite nano-particle, according to the present invention, the metal capable of forming n-type semiconducting chalcogenide nano-particles is selected from the group consisting of of zinc, bismuth, cadmium, mercury, indium, tin, tantalum and titanium.

According to a fifth embodiment of the metal chalcogenide composite nano-particle, according to the present invention, the metal capable of forming p-type semiconducting chalcogenide nano-particles is selected from the group consisting of copper, chromium, iron, lead and nickel.

According to a sixth embodiment of the metal chalcogenide composite nano-particle, according to the present invention, the metal chalcogenide composite particle further contains a metal capable of forming spectrally sensitizing chalcogenide nano-particles with a band-gap between 1.0 and 2.9 eV.

According to a seventh embodiment of the metal chalcogenide composite nano-particle, according to the present invention, the metal chalcogenide composite particle further contains a metal capable of forming spectrally sensitizing chalcogenide nano-particles with a band-gap between 1.0 and 2.9 eV which is selected from the group consisting of silver, lead, copper, bismuth, vanadium and cadmium.

According to an eighth embodiment of the metal chalcogenide composite nano-particle, according to the present invention, the metal chalcogenide composite nano-particle is a coprecipitated metal sulphide composite nano-particle containing zinc and copper.

According to a ninth embodiment of the metal chalcogenide composite nano-particle, according to the present invention, the metal chalcogenide composite nano-particle is a coprecipitated metal sulphide composite nano-particle containing zinc, copper and silver.

According to a tenth embodiment of the metal chalcogenide composite nano-particle, according to the present invention, the metal chalcogenide composite nano-particle is a coprecipitated metal sulphide composite nano-particle containing zinc, copper and silver, wherein the metal is between 40 and 80 atomic percent zinc.

According to an eleventh embodiment of the metal chalcogenide composite nano-particle, according to the present invention, the metal chalcogenide composite nano-particle is a coprecipitated metal sulphide composite nano-particle containing zinc, copper and silver, wherein the metal is between 5 and 25 atomic percent silver.

According to a twelfth embodiment of the metal chalcogenide composite nano-particle, according to the present invention, the metal chalcogenide composite nano-particle is a coprecipitated metal sulphide composite nano-particle containing zinc, copper and silver, wherein the metal is between 15 and 50 atomic percent copper.

The stoichiometry of the metal chalcogenide composite nano-particle, according to the present invention, may be stoichiometric, may have a deficit in chalcogenide or may have a deficit in metal. Photoluminescence, which reduces any photovoltaic effect observed, is known to be quenched by a zinc deficiency in the case of zinc sulphide.

According to a thirteenth embodiment of the metal chalcogenide composite nano-particle, according to the present invention, a stoichiometric deficit of the chalcogenide in the metal chalcogenide composite nano-particle is present in the nano-particle.

According to a fourteenth embodiment of the metal chalcogenide composite nano-particle, according to the present invention, a stoichiometric deficit of the chalcogenide between 1 and 30 atomic percent is present in the nano-particle.

According to a fifteenth embodiment of the metal chalcogenide composite nano-particle, according to the present invention, a stoichiometric deficit of the chalcogenide between 1.5 and 25 atomic percent is present in the nano-particle.

According to a sixteenth embodiment of the metal chalcogenide composite nano-particle, according to the present invention, a stoichiometric deficit of the metal is present in the nano-particle.

X-ray diffraction spectra carried out on the metal chalcogenide composite nano-particles, according to the present invention, were found to be substantially amorphous, although the particle size could be determined from the peak-width of the X-ray diffraction peaks using the Debye-Scherrer equation, values of 1.5 to 5 nm were obtained depending upon the precipitation conditions. The primary particle size was estimated from the peak width to be substantially less than 10 nm and the maximum crystallinity to be 10%.

According to a seventeenth embodiment of the metal chalcogenide composite nano-particle, according to the present invention, the metal chalcogenide composite nano-particle has a crystallinity of 10 percent or less.

Typically particle size distribution measurements carried out with the Disc Centrifuge Photosedimentometer BI-DCP from Brookhaven yielded a weight average diameter of about 75 nm, which decreased after ultrasonic treatment indicating that agglomerates were present and could be at least partially deagglomerated by ultrasonic treatment.

The metal chalcogenide composite nano-particle comprising at least two metals, according to the present invention, can be prepared by coprecipitation, encapsulation, conversion with metal ions, co-chemical vapour deposition or simple mixing followed by a coagulation step such as heat and/or pressure sintering. It is believed that the n-type semiconducting and p-type semiconducting phases form an n-p heterojunction and that this heterojunction provides for charge separation. Spectrophotometric measurements carried out on layers of the metal chalcogenide composite nano-particles, according to the present invention showed transmissions between 55 and 85% in the visible region of the spectrum which are only weakly dependent upon wavelength (see FIG. 1).

Process for Preparing a Dispersion of a Metal Chalcogenide Composite Nano-Particle Aspects of the present invention are realized by a process for preparing a dispersion, according to the present invention, comprising the steps of preparing a composite metal chalcogenide nano-particle containing an n-type semiconducting chalcogenide and a p-type semiconducting p-type semiconducting chalcogenide, wherein at least one of the metal chalcogenides has a band-gap between 1.0 and 2.9 eV.

According to a first embodiment of the process, according to the present invention, the process includes a coprecipitation step, a metal ion conversion step and/or a sintering step. The sintering step may require the application of heat or pressure alone or the combined application of heating and pressure.

According to a second embodiment of the process, according to the present invention, the process includes a coprecipitation step carried out in a medium containing at least one compound selected from the group of thiols, triazole compounds and diazole compounds. Thiols, such as 1-thioglycerol (3-mercapto-1,2-propanediol), triazole compounds and diazole compounds prevent agglomeration of the metal chalcogenide composite nano-particles.

According to a third embodiment of the process, according to the present invention, the process includes the step of mixing the metal chalcogenide composite nano-particles with spectrally sensitizing chalcogenide nano-particles with a band-gap between 1.0 and 2.9 eV.

According to a fourth embodiment of the process, according to the present invention, the process includes the step of mixing the metal chalcogenide composite nano-particles with spectrally sensitizing chalcogenide nano-particles with a band-gap between 1.5 and 2.8 eV.

According to a fifth embodiment of the process, according to the present invention, the process includes the step of mixing the metal chalcogenide composite nano-particles with spectrally sensitizing chalcogenide nano-particles with a band-gap between 1.7 and 2.7 eV.

According to a sixth embodiment of the process, according to the present invention, the process further comprises the step of converting the metal chalcogenide composite nano-particles with metal ions.

According to a seventh embodiment of the process, according to the present invention, the process further includes a diafiltration step.

The metal chalcogenide composite nano-particles, according to the present invention, are prepared using solutions of salts of the respective ions, the metal chalcogenide composite nano-particles produced are preferably washed, diafiltered and then concentrated. The washing media may also contain ingredients such as phosphoric acid, phosphates or thiols, such as 1-thioglycerol, to stabilize or otherwise improve the properties of the metal chalcogenide composite nano-particles.

According to an eighth embodiment of the process, according to the present invention, the process comprises a double jet coprecipitation step. In double jet coprecipitation a first and a second aqueous solution are added simultaneously to a third solution under controlled conditions of temperature and flow rate.

Layer

Aspects of the present invention are also realized by a layer comprising the metal chalcogenide composite nano-particles according to the present invention.

According to a first embodiment of the layer, according to the present invention, the layer has a thickness of less than 500 nm.

According to a second embodiment of the layer, according to the present invention, the layer has a thickness of less than 200 nm.

According to a third embodiment of the layer, according to the present Invention, the layer has a thickness of greater than 20 nm.

Spectrally Sensitizers

According to a fourth embodiment of the layer, according to the present invention, the layer further contains at least one spectral sensitizer for the metal chalcogenide composite nano-particles.

According to a fifth embodiment of the layer, according to the present invention, the layer further contains at least one spectral sensitizer for the metal chalcogenide composite nano-particles selected from the group consisting of metal chalcogenide nano-particles with a band-gap between 1.0 and 2.9 eV, organic dyes, and metallo-organic dyes.

According to a sixth embodiment of the layer, according to the present invention, the layer further contains at least one spectral sensitizer for the metal chalcogenide composite nano-particles selected from the group consisting of metal chalcogenide nano-particles with a band-gap between 1.5 and 2.8 eV, organic dyes, and metallo-organic dyes.

According to a seventh embodiment of the layer, according to the present invention, the layer further contains at least one spectral sensitizer for the metal chalcogenide composite nano-particles selected from the group consisting of metal chalcogenide nano-particles with a band-gap between 1.7 and 2.7 eV, organic dyes, and metallo-organic dyes.

According to an eighth embodiment of the layer, according to the present invention, the layer further contains at least one spectral sensitizer for the metal chalcogenide composite nano-particles selected from the group consisting of metal oxides, metal sulphides and metal selenides.

According to a ninth embodiment of the layer, according to the present invention, the layer further contains at least one spectral sensitizer for the metal chalcogenide composite nano-particles selected from the group consisting of lead sulphide, bismuth sulphide, cadmium sulphide, silver sul- phide, antimony sulphide, indium sulphide, copper sulphide, cadmium selenide, copper selenide, indium selenide and cadmium telluride.

Suitable spectrally sensitizing organic dyes (SSOD) include cyanine, merocyanine and anionic dyes, such as:

SSOD-01

SSOD-02

SSOD-03

SSOD-04

SSOD-05

Suitable spectrally sensitizing metallo-organic dyes allowing for broad absorption of the solar spectrum include:

| | chemical name |
|---|---|
| Ruthenium 470, a ruthenium dye from Solaronix | tris(2,2'bipyridyl-4,4' dicarboxylato) ruthenium (II) dichloride |
| Ruthenium 505, a ruthenium dye from Solaronix | cis-bis(isocyanato) (2,2'bipyridyl-4,4' dicarboxylato) ruthenium (II) |
| Ruthenium 535 (previously known as SRS-HQ, N3), a ruthenium dye from Solaronix | cis-bis(isothiocyanato)bis(2,2'-bipyridyl-4,4'-dicarboxylato)-ruthenium (II) |
| Ruthenium 535 bis-TBA (previously known as MRS-HQ, N719, dye salt) a ruthenium dye from Solaronix | cis-bis(isothiocyanato)bis(2,2'-bipyridyl-4,4'-dicarboxylato)-ruthenium (II) bis-tetrabutylammonium |

| Ruthenium 620 "Black Dye", a ruthenium dye from Solaronix | (anion only) tris(isothiocyanato)-ruthenium (II)-2,2':6',2"-terpyridine-4,4',4"-tricarboxylic acid |

Triazole or Diazole Compound

According to a preferred embodiment of the process, according to the present invention, the process further comprises a precipitation step carried out in a medium containing at least one of a triazole compound and a diazole compound.

According to a ninth embodiment of the process, according to the present invention, the process further comprises a precipitation step carried out in a medium containing a tetraazaindene, a triazole compound.

According to a tenth embodiment of the process, according to the present invention, the process further comprises a precipitation step carried out in a medium containing a triazole compound selected from the group consisting of Suitable triazole or diazole compounds, according to the present invention, include:

the group consisting of, orthophosphoric acid, phosphorous acid, hypophosphorous acid and polyphosphoric acids.

Polyphosphoric acids include diphosphoric acid, pyrophosphoric acid, triphosphoric acid, tetraphosphoric acid, metaphosphoric acid and "polyphosphoric acid".

According to a thirteenth embodiment of the nano-porous metal oxide, according to the present invention, the phosphate is selected from the group consisting of orthophosphates, phosphates, phosphites, hypophosphites and polyphosphates.

Polyphosphates are linear polyphosphates, cyclic polyphosphates or mixtures thereof. Linear polyphosphates contain 2 to 15 phosphorus atoms and include pyrophosphates, dipolyphosphates, tripolyphosphates and tetrapolyphosphates. Cyclic polyphosphates contain 3 to 8 phosphorus atoms and include trimetaphosphates and tetrametaphosphates and metaphosphates.

Polyphosphoric acid may be prepared by heating $H_3PO_4$ with sufficient $P_4O_{10}$ (phosphoric anhydride) or by heating $H_3PO_4$ to remove water. A $P_4O_{10}/H_2O$ mixture containing 72.74% $P_4O_{10}$ corresponds to pure $H_3PO_4$, but the usual commercial grades of the acid contain more water. As the $P_4O_{10}$ content $H_4P_2O_7$, pyrophosphoric acid, forms along

| T1 |  | 5-methyl-1,2,4-triazolo-(1,5-a)-pyrimidine-7-ol |
|---|---|---|
| T2 |  | |
| T3 |  | |
| D1 |  | |

Phosphoric Acid or Phosphate

According to an eleventh embodiment of the process, according to the present invention, the process further includes a diafiltration process in which the washing medium in the diafiltration process contains a phosphoric acid or a phosphoric acid salt.

According to a twelfth embodiment of the process, according to the present invention, the process further includes a diafiltration process in which the washing medium in the diafiltration process contains a phosphoric acid selected from with $P_3$ through $P_8$ polyphosphoric acids. Triphosphoric acid appears at 71.7% $P_2O_5$ ($H_5P_3O_{10}$) and tetraphosphoric acid ($H_6P_4O_{13}$) at about 75.5% $P_2O_5$. Such linear polyphosphoric acids have 2 to 15 phosphorus atoms, which each bear a strongly acidic OH group. In addition, the two terminal P atoms are each bonded to a weakly acidic OH group. Cyclic polyphosphoric acids or metaphosphoric acids, $H_nP_nO_{3n}$, which are formed from low-molecular polyphosphoric acids by ring closure, have a comparatively small number of ring atoms (n=3-8). Each atom in the ring is bound to one strongly acidic OH group. High linear and cyclic polyphosphoric acids are present only at acid concentrations above 82% $P_2O_5$.

Commercial phosphoric acid has a 82 to 85% by weight $P_2O_5$ content. It consists of about 55% tripolyphosphoric acid, the remainder being $H_3PO_4$ and other polyphosphoric acids.

A polyphosphoric acid suitable for use according to the present invention is a 84% (as $P_2O_5$) polyphosphoric acid supplied by ACROS (Cat. No. 19695-0025).

Binder

According to a tenth embodiment of the layer, according to the present invention, the layer further contains a binder.

According to an eleventh embodiment of the layer, according to the present invention, the layer further contains polyvinylpyrrolidone).

Adding a binder to the dispersion improves the layer quality and photovoltaic properties of layers, according to the present invention, and up to a weight ratio of 10% binder to metal chalcogenide composite nano-particles. Too much binder, e.g. a weight ratio of 50% binder to metal chalcogenide composite nano-particles, adversely affects the photovoltaic properties. This is probably due to adversely affecting the percolation threshold of the n-and p-type semiconducting particles thereby reducing the short circuit current.

Suitable binders include: polyvinylpyrrolidone); cellulose and cellulose derivatives, such as carboxymethylcellulose, hydroxypropylcellulose, hydroxyethylcellulose, methyl cellulose, ethyl cellulose, quaternary ammonium cellulose derivatives (e.g. Celquat™); polyacrylic acid, polymethacrylic acid, poly(styrenesulphonic acid); polyallylamine; copolymers of methylvinylether and maleic anhydride; gelatine and polyvinylalcohol.

Support

Supports for use according to the present invention include polymeric films, silicon, ceramics, oxides, glass, polymeric film reinforced glass, glass/plastic laminates, metal/plastic laminates, paper and laminated paper, optionally treated, provided with a subbing layer or other adhesion promoting means to aid adhesion to the layer configuration, according to the present invention. Suitable polymeric films are poly(ethylene terephthalate), poly(ethylene naphthalate), polystyrene, polyethersulphone, polycarbonate, polyacrylate, polyamide, polyimides, cellulosetriacetate, polyolefins and poly (vinylchloride), optionally treated by corona discharge or glow discharge or provided with a subbing layer.

Photovoltaic Devices

Aspects of the present invention are also realized by a photovoltaic device comprising a layer according to the present invention.

According to a first embodiment of the photovoltaic device, according to the present invention, the photovoltaic device comprises two electrodes at least one of which is transparent. Suitable transparent electrodes are inorganic transparent electrodes, such as indium tin oxide, $SnO_2$:F, tin antimony oxide, zinc oxide, vanadium pentoxide and copper iodide, and organic transparent electrodes, such as polyaniline, poly(3,4-ethylenedioxythiophene) etc.

Photovoltaic devices comprising a layer, according to the present invention, can be of two types: the regenerative type which converts light into electrical power leaving no net chemical change behind in which current-carrying electrons are transported to the anode and the external circuit and the holes are transported to the cathode where they are oxidized by the electrons from the external circuit and the photosynthetic type in which there are two redox systems one reacting with the holes at the surface of the semiconductor electrode and one reacting with the electrons entering the counter-electrode, for example, water is oxidized to oxygen at the semiconductor photoanode and reduced to hydrogen at the cathode. The charge transporting process can be ionic or electronic.

Such regenerative photovoltaic devices can have a variety of internal structures in conformity with the end use. Conceivable forms are roughly divided into two types: structures which receive light from both sides and those which receive light from one side. An example of the former is a structure made up of a transparently conductive layer e.g. an ITO-layer or a PEDOT/PSS-containing layer and a transparent counter electrode electrically conductive layer e.g. an ITO-layer or a PEDOT/PSS-containing layer having interposed therebetween a photosensitive layer and a charge transporting layer. Such devices preferably have their sides sealed with a polymer, an adhesive etc. to prevent deterioration or volatilization of the inside substances. The external circuit connected to the electrically-conductive substrate and the counter electrode via the respective leads is well-known.

Industrial Application

Layers, according to the present invention, can be used in both regenerative and photosynthetic photovoltaic devices.

The invention is illustrated hereinafter by way of EXAMPLES and photovoltaic devices. The percentages and ratios given in these examples are by weight unless otherwise indicated.

EXAMPLES

Preparation of a ZnS Nano-Particle Dispersion

The following solutions were prepared:

| Solution 1: | $ZnCl_2 \cdot 2H_2O$ | 81.76 g (0.47 moles) |
|---|---|---|
| | deionized water | made up to 600 mL |
| Solution 2: | $Na_2S \cdot 9H_2O$ | 140.22 g (0.57 moles) |
| | $NH_3$ (50%) | 4.5 mL |
| | deionized water | made up to 600 mL |

Dispersion 1:

The ZnS dispersion 20% substoichiometric in zinc was prepared as follows: first solutions 1 and 2 were added simultaneously at 25° C. at a flow rate of 500 mL/min to 1000 mL of deionized water maintained at 25° C. and stirred at 1500 rpm. To 1000 mL of the resulting dispersion, 1000 mL of a 5% thioglycerol solution in water were added and the dispersion concentrated to 1000 mL by means of a Fresenius F60 cartridge. This dispersion was subsequently diafiltered by using 5000 mL of a 5% solution of thioglycerol in water. This dispersion was then further diafiltered using 2000 mL of deionized water. The dispersion was further concentrated to a volume of about 570 mL (0.382M in $ZnS_x$). A concentration of 25 g/L of Zn was determined by ICP. Absorption measurements showed a bandgap of around 295 nm, indicating particle sizes below 4 nm, according to the Brus's equation [L. E. Brus, J. Chem. Phys. 80(9), 4403-4409 (1984)].

Preparation of a CuS$_x$ Nano-Particle Dispersion

The following solutions were prepared:

| Solution 3: | CuCl$_2$•2H$_2$O | 37.5 g (0.22 moles) |
| --- | --- | --- |
| | deionized water | made up to 600 mL |
| Solution 4: | Na$_2$S•9H$_2$O | 51.88 g (0.21 moles) |
| | NaOH (50%) | 1.7 mL |
| | deionized water | made up to 600 mL |
| Solution 5: | 1-thioglycerol | 50 mL |
| | deionized water | made up to 750 mL |

Dispersion 2:

The Cu$_x$S dispersion 4.5% substoichiometric in sulphur was prepared as follows: solutions 3 and 4 were added simultaneously at 25° C. and a flow rate of 500 mL/min to solution 5 maintained at 25° C. and stirred at 1500 rpm. 1000 mL of the resulting dispersion was diafiltered using 5000 mL of a 5% solution of thioglycerol in water. This dispersion was then further diafiltered using 2000 mL of deionized water. Finally the dispersion was further concentrated to a volume of about 200 mL. A concentration of 25 g/L (0.393M) of Cu was determined by ICP. Absorption measurements showed a bandgap of around 520 nm, indicating nano sized particles according to quantum confinement of nano-particles (the bulk bandgap of Cu$_x$S lies in the range 700-1000 nm depending on its stoichiometry and crystal structure). This is dispersion 2.

Mixing Nano-Particle Dispersions of ZnS$_x$ and CuS$_x$

Coating Dispersion A:

35.1 mL of dispersion 1 (0.382M) was mixed with 3.9 mL of dispersion 2 (0.393M) and to this 1 mL of a 1% solution in water of ZONYL FSN 100 (Dupont) was added to produce coating dispersion A with 90 mole % ZnS$_x$ and 10 mole % CuS$_x$.

Coating Dispersion B:

31.2 mL of dispersion 1 (0.382M) was mixed with 7.8 mL of dispersion 2 (0.393M} and to this 1 mL of a 1% solution in water of ZONYL FSN 100 (Dupont) was added to produce coating dispersion B with 80 mole % ZnS$_x$ and 20 mole % CuS$_x$.

Preparation of Dispersions of Zn(99 at %)C(1 at %) Metal Sulphide Nano-Particles (=EXAMPLE 1.1 of EP-A 1 231 250)

The following solutions were prepared:

| Solution 6: | ZnCl$_2$•2H$_2$O | 81.76 g (0.60 moles) |
| --- | --- | --- |
| | deionized water | made up to 600 mL |
| Solution 7: | Na$_2$S•9H$_2$O | 141.6 g (0.60 moles) |
| | NaOH (50%) | 3.6 mL |
| | deionized water | made up to 600 mL |
| Solution 8: | CuCl$_2$ | 0.85 g (0.0063 moles) |
| | deionized water | made up to 800 mL |

Dispersion 3:

The Zn(99 at %)Cu(1 at %) metal sulphide nano-particle dispersion 1% substoichiometric in sulphur was prepared as follows: 0.5 mL of solution 7 was first added to solution 8 maintained at 25° C. and stirred at 1500 rpm and then solutions 6 and 7 were added simultaneously at 25° C. and at a flow rate of 500 mL/min. To 1000 mL of the resulting dispersion, 1000 mL of a 2% sodium polyphosphate solution was added to stabilize the nano-particle dispersion and this dispersion concentrated to 1000 mL by means of a Fresenius F60 cartridge. This dispersion was then diafiltered using 6000 mL of a 2% solution of sodium polyphosphate in deionized water. The dispersion was further concentrated to a concentration of about 35 g ZnS/L (0.36M). This is dispersion 3.

Coating Dispersion C:

1 mL of a 12.5% solution in water/ethanol (80/20) of Saponine Quillaya (Schmittmann) was added per 20 mL of dispersion 3 to prepare coating dispersion C.

Preparation of Dispersions of Zn(92 at %)C(8 at %) Metal Sulphide Nano-Particles The following solutions were prepared:

| Solution 9: | Zn(CH$_3$COO)$_2$•2H$_2$O | 148.16 g (0.675 moles) |
| --- | --- | --- |
| | Cu(CH$_3$COO)$_2$•H$_2$O | 10.9 g (0.060 moles) |
| | deionized water | made up to 600 mL |
| Solution 10: | Na$_2$S•9H$_2$O | 168.3 g (0.685 moles) |
| | NaOH (50%) | 4.3 mL |
| | deionized water | made up to 600 mL |
| Solution 11: | NaCl | 58.44 g |
| | deionized water | made up to 1000 mL |

Dispersion 4:

The Zn(91.8 at %)Cu(8.2 at %) metal sulphide nano-particle dispersion substoichiometric in sulphur was prepared as follows: 0.5 mL of solution 9 was added to solution 11 maintained at 25° C. and stirred at 1500 rpm and then solutions 9 and 10 were added simultaneously at 25° C. and at a flow rate of 500 mL/min. To 1000 mL of the resulting dispersion, 1000 mL of a 2% polyphosphoric acid solution was added to stabilize the nano-particle dispersion and the dispersion concentrated to 1000 mL by means of a Fresenius F60 cartridge. This dispersion was then diafiltered using 6000 mL of a 2% solution of polyphosphoric acid in water. The dispersion was further concentrated to a volume of about 570 mL (0.36M) to produce dispersion 4. On average 20 to 30% by weight of the dispersion is lost during the washing and concentration processes through ion exchange, loss of small particles in the pores of the Fresenius cartridge etc.

Coating Dispersion D:

0.5 mL of a 1% solution in water of ZONYL™ FSN 100 (Dupont) was added to 19.5 mL of dispersion 4 to prepare coating dispersion D.

Preparation of Dispersions of Zn(83 at %)Cu(17 at %) Metal Sulphide Nano-Particles The following solutions were prepared:

| Solution 12: | Zn(CH$_3$COO)$_2$•2H$_2$O | 131.7 g (0.600 moles) |
| --- | --- | --- |
| | Cu(CH$_3$COO)$_2$•H$_2$O | 21.8 g (0.120 moles) |
| | deionized water | made up to 600 mL |

Dispersion 5:

The Zn(83.3 at %)Cu(16.7 at %) metal sulphide nano-particle dispersion substoichiometric in sulphur was prepared as follows: 0.5 mL of solution 12 was added to solution 11 maintained at 25° C. and stirred at 1500 rpm and then solutions 10 and 12 were added simultaneously at 25° C. and at a flow rate of 500 mL/min. To 1000 mL of the resulting dispersion, 1000 mL of a 2% polyphosphoric acid solution was added and the dispersion concentrated to 1000 mL using a Fresenius F60 cartridge. This dispersion was then diafiltered using 6000 mL of a 2% solution of polyphosphoric acid in water. The dispersion was further concentrated to a volume of about 570 mL (0.36M) to produce dispersion 5.

Coating Dispersion E:

0.5 mL of a 1% solution in water of ZONYL™ FSN 100 (Dupont) was added to 19.5 mL of dispersion 5 (0.36M) to prepare coating dispersion E.

Coating Dispersion F:

1.35 mL of a 5% solution of polyvinylpyrrolidone (LUVISKOL K-90; BASF) in water and 0.5 mL of a 1% solution of ZONYL™ FSN 100 (Dupont) in water were added to 18.15 mL of dispersion 5 (0.36M) to prepare coating dispersion F with a weight ratio of binder to metal sulphide particles of 1:10.

Preparation of a Dispersion of $Ag_2S$ Nano-Particles

The following solutions were prepared:

| Solution 13: | Polyvinylpyrrolidone (27% in $H_2O$) | 20 g |
| | $AgNO_3$ (5.8 M in water) | 12.93 mL (0.0750 moles) |
| | deionized water | made up to 600 mL |
| Solution 14: | $Na_2S_2O_3 \cdot 5H_2O$ | 9.5 g (0.0383 moles) |
| | deionized water | made up to 600 mL |
| Solution 15: | T1 | 15.0 g |
| | NaOH | 1.5 g |
| | deionized water | made up to 650 mL |

Dispersion 6:

The $Ag_2S$ nano-dispersion 2.1% superstoichiometric in sulphur was prepared as follows: to solution 15, held at 4° C. and stirred at 1500 rpm, solutions 13 and 14 were added simultaneously both at 4° C. at a flow rate of 500 mL/min. This is dispersion 6 which contained approximately 5 g/L (0.00403M} $Ag_2S$ nano-particles.

Mixing of Nano-Particle Dispersions of Zn(83 at %)Cu(17 at %) Metal Sulphide and Silver Sulphide Coating Dispersion G:

20 mL of dispersion 6 (0.00403M} was mixed with 10 mL of dispersion F to produce coating dispersion G containing approximately 98 mol % Zn(83 at %)Cu(17 at %) metal sulphide nano-particles and 2 mol % $Ag_2S$ nano-particles.

Preparation of a Dispersion of ZnCuAg Metal Sulphide Nano-Particles by Converting Zn(83 at %)Cu(17 at %) Metal Sulphide Nano-Particles with 0.004 Moles of $Ag^+$-ions The following solution was prepared:

| Solution 16 | $AgNO_3$ (5.8 M in water) | 0.69 mL (0.0040 moles) |
| | Triammonium citrate | 12.36 g |
| | deionized water | made up to 18.34 mL |

Dispersion 7:

200 mL of dispersion 5 [Zn(83.3 at %)Cu(16.7 at %)S] was mixed with 18.34 mL of solution 16 (0.004 moles $Ag^+$) with stirring. To 200 mL of this mixture, 200 mL of a 2% polyphosphoric acid solution was added and the dispersion concentrated to 200 mL by means of a Fresenius F60 cartridge. This dispersion was then diafiltered using 1000 mL of a 2% solution of polyphosphoric acid in water. The dispersion was then further concentrated to a volume of about 200 mL (0.36M) of ZnCuAg metal sulphide nano-particles. In the absence of analysis the composition of the metal component of the resulting ZnCuAg metal sulphide nano-particles is unknown, but it is reasonable to assume in view of zinc ions having the highest solubility product that it is zinc ions, which were for the most part displaced by silver ions.

Coating Dispersion H:

33.2 mL of dispersion 7 was ultrasonically treated for 6 minutes of ultrasound treatment, followed by the addition of 2.5 mL of a 5% solution of polyvinylpyrrolidone (LUVISKOL K-90; BASF) in water and 1 mL, of a 1% solution of ZONYL™ FSN 100 (Dupont) in water to produce coating dispersion H.

Preparation of a Dispersion of Zn(75 at %)Cu(20 at %)Ag(5at %) Metal Sulphide Nano-Particles by Precipitation The following solutions were prepared:

| Solution 17: | $Zn(NO_3)_2 \cdot 6H_2O$ | 134 g (0.450 moles) |
| | $Cu(NO_3)_2 \cdot 3H_2O$ | 29 g (0.120 moles) |
| | $AgNO_3$ (5.8 M in water) | 5.17 mL (0.0300 moles) |
| | deionized water | made up to 600 mL |
| Solution 18: | $Na_2S \cdot 9H_2O$ | 112.2 g (0.457 moles) |
| | deionized water | made up to 600 mL |
| Solution 19: | T1 | 20.0 g |
| | NaOH | 2 g |
| | deionized water | made up to 1000 mL |

Dispersion 8:

The Zn(75 at %)Cu(20 at %)Ag(5 at %) metal sulphide nano-particle dispersion 24% substoichiometric in sulphur was prepared as follows: solutions 17 and 18 were added simultaneously at 25° C. and at a flow rate of 500 mL/min to solution 19 maintained at 25° C. and stirred at 1500 rpm. To 1000 mL of the resulting dispersion, 1000 mL of a 2% polyphosphoric acid solution was added and the dispersion concentrated to 1000 mL using a Fresenius F60 cartridge. This dispersion was then diafiltered using 6000 mL of a 2% solution of polyphosphoric acid in water. The dispersion was then further concentrated to a volume of about 570 mL.

Coating Dispersion I:

1.35 mL of a 5% solution of polyvinylpyrrolidone (LUVISKOL K-90; BASF) in water and 0.5 mL of a 1% solution of ZONYL™ FSN 100 (Dupont) in water was added to 18,15 mL of dispersion 8 to produce coating dispersion I with a weight ratio of binder to metal sulphide particles of 1:10.

Coating Dispersion J:

6.75 mL of a 5% solution of polyvinylpyrrolidone (LUVISKOL K-90; BASF) in water and 0.5 mL of a 1% solution of ZONYL™ FSN 100 (Dupont) in water was added to 12.75 mL of dispersion 8 to produce coating dispersion J with a weight ratio of binder to metal sulphide particles of 1:2.

Preparation of a Dispersion of Zn(65 at %)Cu(20 at %)Ag(5 at %) Metal Sulphide Nano-Particles by Precipitation The following solution was prepared:

| Solution 20: | $Zn(NO_3)_2 \cdot 6H_2O$ | 116.1 g (0.390 moles) |
|---|---|---|
| | $Cu(NO_3)_2 \cdot 3H_2O$ | 29 g (0.120 moles) |
| | $AgNO_3$ (5.8 M in water) deionized water | 15.5 mL (0.090 moles) made up to 600 mL |

Dispersion 9:

The Zn(65 at %)Cu(20 at %)Ag(5 at %) metal sulphide nano-particle dispersion 24% substoichiometric in sulphur was prepared as follows: solutions 20 and 18 were added simultaneously at 25° C. and at a flow rate of 500 mL/min to solution 19 maintained at 25° C. and stirred at 1500 rpm. To 1000 mL of the resulting dispersion, 1000 mL of a 2% polyphosphoric acid solution was added and the dispersion concentrated to 1000 mL by means of a Fresenius F60 cartridge. This dispersion was then diafiltered by using 6000 mL of a 2% solution of polyphosphoric acid in water. The dispersion was then further concentrated to a volume of about 570 mL.

Coating Dispersion K:

1.35 mL of a 5% solution of polyvinylpyrrolidone (LUVISKOL K-90; BASF) in water and 0.5 mL of a 1% solution of ZONYL™ FSN 100 (Dupont) in water was added to 18.15 mL of dispersion 9 to produce coating dispersion K with a weight ratio of binder/metal sulphide particles of 1:10.

Preparation of a Dispersion of Zn(45 at %)Cu(40 at %)Ag(15 at %) Metal Sulphide Nano-Particles by Precipitation The following solution was prepared:

| Solution 21: | $Zn(NO_3)_2 \cdot 6H_2O$ | 80.4 g (0.270 moles) |
|---|---|---|
| | $Cu(NO_3)_2 \cdot 3H_2O$ | 58 g (0.240 moles) |
| | $AgNO_3$ (5.8 M in water) deionized water | 15.5 mL (0.090 moles) made up to 600 mL |

Dispersion 10:

The Zn(45 at %)Cu(40 at %)Ag(15 at %) metal sulphide nano-particle dispersion 24% substoichiometric in sulphur was prepared as follows: solutions 21 and 18 were added simultaneously at 25° C. and at a flow rate of 500 mL/min to solution 19 maintained at 25° C. and stirred at 1500 rpm. To 1000 mL of the resulting dispersion, 1000 mL of a 2% polyphosphoric acid solution was added and the dispersion concentrated to 1000 mL by means of a Fresenius F60 cartridge. This dispersion was then diafiltered using 6000 mL of a 2% solution of polyphosphoric acid in water. The dispersion was then further concentrated to a volume of about 570 mL.

Coating Dispersion L:

1.35 mL of a 5% solution of polyvinylpyrrolidone (LUVISKOL K-90; BASF) in water and 0.5 mL of a 1% solution of ZONYL™ FSN 100 (Dupont) in water was added to 18.15 mL of dispersion 10 to produce coating dispersion L with a weight ratio of binder/metal sulphide particles of 1:10.

Photovoltaic Devices

Photovoltaic devices was built up on an ITO layer on a PET substrate (IST-ISF) (5×5 cm) with a surface conductivity of about 80Ohm/square, which was patterned using $HNO_3$. Two borders of about 1.5 cm were treated with $HNO_3$ in order to destroy the conductivity to produce a conductive area in the middle of the material with dimensions 5 cm×2 cm. Coating dispersions A, B and D to L were filtered through a 5 μm MILLIPORE® filter and put on a roller machine for 1 h. 20 mL of each dispersion was then ultrasonically treated with a ultrasound bar (Vibra cell VCX 400 W from Sonics & Materials Inc.—amplitude about 78%—output 40%) for 3 minutes leaving the dispersion in ice so it did not become hot. The resulting dispersions were then spincoated on these substrates twice at 1000 rpm to yield a nano-particle layer thickness of about 100 nm.

Figure 1:
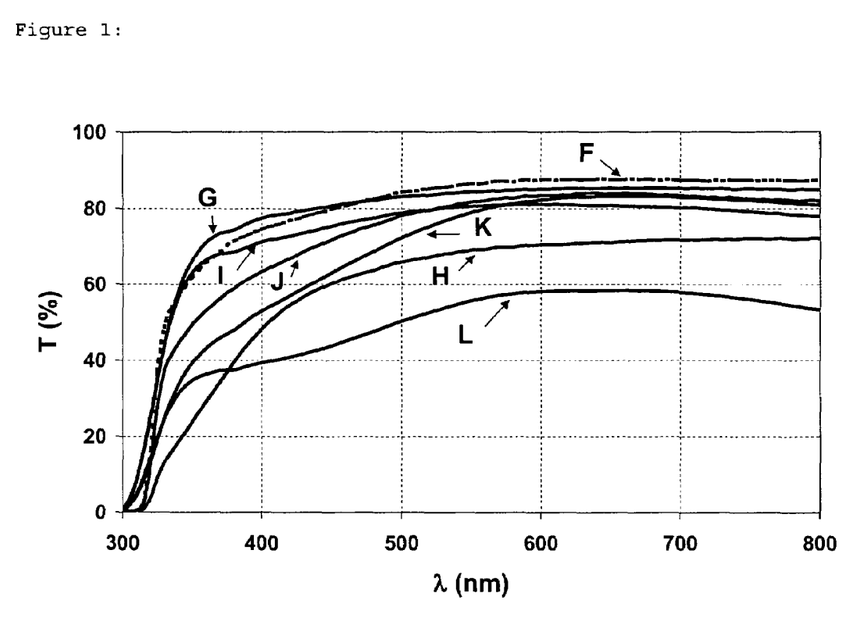
FIG. 1 represents the dependences of transmission, T, in % upon wavelength, λ, in nm for ca. 100 nm thick layers prepared with coating dispersions F, G, H, I, J, K and L (see the INVENTION EXAMPLES for the compositions of these coating dispersions).

Spectrophotometric measurements were carried out on the ca. 100 nm thick layers prepared with coating dispersions F, G, H, I, J, K and L. The absorption spectra obtained are shown in FIG. 1. The maximum transmission increased from about 57% for coating dispersion L to 84% for coating dispersion F and increased in the order F<G<I=J=K<L. The absorption spectra for 100 nm thick layers prepared with coating dispersions F, G, H, I, J, K and L are shown in FIG. 1. The high absorption with the layer prepared with coating dispersion H resulted from opacity, which was due to a very high haze probably due to larger agglomerates. Only in the cases of the transparent layers prepared with coating dispersions J, K and L was a pronounced variation in absorption with wavelength observed.

Finally 160 nm thick aluminum electrode (cathode) layers were vacuum deposited on the spincoated layers at $10^{-6}$ Torr via a mask. The active area was 25 $mm^2$.

Device Evaluation

The thereby prepared photovoltaic cells were irradiated with a Xenon Arc Discharge lamp with a power of 75 mW/$cm^2$. The current generated was recorded with a Keithley electrometer (Type 2420). The open circuit voltage ($V_{OC}$) (i.e. voltage by zero current) and short circuit current density ($I_{SC}$) (i.e. current by zero voltage) obtained are given in Table 1.

TABLE 1

| Dispersion | Composition | sulphur deficit (at %) | PVP** | $I_{sc}$ (μA/$cm^2$) | $V_{oc}$ (V) |
|---|---|---|---|---|---|
| A (comp.) | mixture of 90 mol % ZnS & 10 mol % $Cu_xS$ | */4.5 | No | 1.4 | 0.020 |
| B (comp.) | mixture of 80 mol % ZnS & 20 mol % $Cu_xS$ | */4.5 | No | 1.3 | 0.040 |
| C (comp.) | Zn (99at %) Cu (1at %) metal sulphide via coprecipitation | 1.0 | No | 0.04 | 0.070 |
| D (inv.) | Zn (92at %) Cu (8at %) metal sulphide via coprecipitation | 6.8 | No | 2.6 | 0.275 |
| E (inv.) | Zn (83at %) Cu (17at %) metal sulphide via coprecipitation | 4.9 | No | 4.6 | 0.100 |
| F (inv.) | Zn (83at %) Cu (17at %) metal sulphide via coprecipitation with binder (PVP) | 4.9 | 10% | 4.0 | 0.400 |
| G (inv.) | mixture of coprecipitated Zn (83at %) Cu (17at %) metal sulphide, PVP and $Ag_2S$ (mol. ratio 98:2) | 4.9 | 10% | 9.6 | 0.400 |
| H (inv.) | Zn (83at %) Cu (17at %) metal sulphide modified by $Ag^+$ conversion | 4.9 | 10% | 7.6 | 0.380 |
| I | Zn (75at %) Cu (20at %) | 24 | 10% | 16.0 | 0.700 |

TABLE 1-continued

| Dispersion | Composition | sulphur deficit (at %) | PVP** | $I_{sc}$ ($\mu A/cm^2$) | $V_{oc}$ (V) |
|---|---|---|---|---|---|
| J (inv.) | Ag (5at %) metal sulphide via coprecipitation Zn (75at %) Cu (20at %) Ag (5at %) metal sulphide via coprecipitation | 24 | 50% | 2.8 | 0.200 |
| K (inv.) | Zn (65at %) Cu (20at %) Ag (15at %) metal sulphide via coprecipitation | 24 | 10% | 10.0 | 0.600 |
| L (inv.) | Zn (45at %) Cu (40at %) Ag (15at %) metal sulphide via coprecipitation | 24 | 10% | 30.0 | 0.950 |

*20% substoichiometric in zinc
**PVP = polyvinylpyrrolidone, amount in weight percentage versus metal sulphide The results in Table 1 show that no significant photovoltaic response was obtainable at a p-type semiconductor concentration of 1 atomic % of the metal. Such materials exhibited electroluminescence as disclosed in EP-A 1 231 250, which at such low concentrations quenched any photovoltaic effects. However, at concentrations of p-type semiconductors above 5 atomic % of the metal photovoltaic effects were surprisingly observed.

The results in Table 1 further show that incorporation of low bandgap $Ag_2S$ improved the photovoltaic response as well as increasing the light absorption, which was evident from the brownish coloration of the photovoltaic layers containing $Ag_2S$. Therefore, $Ag_2S$ acts as a spectral sensitizer.

These results further show that although spectral sensitization with $Ag_2S$ could be realized by simple mixing with the metal chalcogenide composite nano-particles of the present invention or by incorporation in the metal chalcogenide composite nano-particles by conversion or coprecipitation, coprecipitation produced the best photovoltaic properties.

Variation in chalcogenide deficit between 4.9% and 24% had no dramatic effect on the photovoltaic effect observed as can be seen by comparing the short circuit currents obtained with photovoltaic devices incorporating a layer coated with Dispersion G with that incorporating a layer coated with Dispersion I.

Adding a binder to the dispersion improved the layer quality and the photovoltaic properties up to a weight ratio of 10% binder to metal chalcogenide composite nano-particles. Too much binder, e.g. a weight ratio of 50% binder to metal chalcogenide composite nano-particles (Dispersion J) had an adverse effect on the photovoltaic properties.

Photovoltaic devices incorporating a layer coated with Dispersion L exhibited the highest photocurrent, which was probably due to the fact that the n-type (ZnS) and p-type ($Cu_xS$) semi-conducting material was present in similar concentrations.

The present invention may include any feature or combination of features disclosed herein either implicitly or explicitly or any generalisation thereof irrespective of whether it relates to the presently claimed invention. In view of the foregoing description it will be evident to a person skilled in the art that various modifications may be made within the scope of the invention.

Having described in detail preferred embodiments of the current invention, it will now be apparent to those skilled in the art that numerous modifications can be made therein without departing from the scope of the invention as defined in the following claims.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Of course, variations of those preferred embodiments will become apparent to those of ordinary skill in the art upon reading the foregoing description. The inventors expect skilled artisans to employ such variations as appropriate, and the inventors intend for the invention to be practised otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

I claim:

1. A metal chalcogenide composite nano-particle comprising a metal capable of forming p-type semiconducting chalcogenide nano-particles and a metal capable of forming n-type semiconducting chalcogenide nano-particles, wherein at least one of said metal chalcogenides has a band-gap between 1.0 and 2.9 eV and the concentration of said metal capable of forming p-type semiconducting chalcogenide nano-particles is at least 5 atomic percent of said metal and is less than 50 atomic percent of said metal, wherein said metal capable of forming n-type semiconducting chalcogenide nano-particles is selected from the group consisting of zinc, bismuth, indium, tin, tantalum and titanium, and wherein said metal chalcogenide composite particle further comprises a metal capable of forming spectrally sensitizing chalcogenide nano-particles with a band-gap between 1.0 and 2.9 eV is selected from the group consisting of silver, lead, copper, bismuth, vanadium and cadmium.

2. A metal chalcogenide composite nano-particle comprising a metal capable of forming p-type semiconducting chalcogenide nano-particles and a metal capable of forming n-type semiconducting chalcogenide nano-particles, wherein at least one of said metal chalcogenides has a band-gap between 1.0 and 2.9 eV and the concentration of said metal capable of forming p-type semiconducting chalcogenide nano-particles is at least 5 atomic percent of said metal and is less than 50 atomic percent of said metal, and wherein a stoichiometric deficit of the chalcogenide in said metal chalcogenide composite nano-particle is present.

3. The metal chalcogenide composite nano-particle according to claim 2, wherein said metal chalcogenide composite nano-particle comprises a p-type semiconducting metal chalcogenide phase and a n-type semiconducting chalcogenide phase, and wherein the concentration of said p-type semiconducting metal chalcogenide in said metal chalcogenide composite nano-particle is at least 5 mole percent and is less than 50 mole percent.

4. The metal chalcogenide composite nano-particle according to claim 2, wherein said metal chalcogenide composite particle is a coprecipitated particle.

5. The metal chalcogenide composite nano-particle according to claim 2, wherein said metal chalcogenide composite particle is a metal sulphide composite particle.

6. The metal chalcogenide composite nano-particle according to claim 2, wherein said metal capable of forming n-type semiconducting chalcogenide nano-particles is selected from the group consisting of zinc, bismuth, cadmium, mercury, indium, tin, tantalum and titanium.

7. The metal chalcogenide composite nano-particle according to claim 6, wherein said metal capable of forming p-type semiconducting chalcogenide nano-particles is selected from the group consisting of copper, chromium, iron, lead and nickel.

8. The metal chalcogenide composite nano-particle according to claim 7, wherein said metal chalcogenide composite particle further comprises a metal capable of forming spectrally sensitizing chalcogenide nano-particles with a band-gap between 1.0 and 2.9 eV, and wherein said metal capable of forming spectrally sensitizing chalcogenide nano-particles is selected from the group consisting of silver, lead, copper, bismuth, vanadium and cadmium.

9. The metal chalcogenide composite nano-particle according to claim 2, wherein said metal capable of forming p-type semiconducting chalcogenide nano-particles is selected from the group consisting of copper, chromium, iron, lead and nickel.

10. The metal chalcogenide composite nano-particle according to claim 2, wherein said metal chalcogenide composite particle further comprises a metal capable of forming spectrally sensitizing chalcogenide nano-particles with a band-gap between 1.0 and 2.9 eV.

11. The metal chalcogenide composite nano-particle according to claim 10, wherein said metal capable of forming spectrally sensitizing chalcogenide nano-particles is selected from the group consisting of silver, lead, copper, bismuth, vanadium and cadmium.

12. A metal chalcogenide composite nano-particle comprising a metal capable of forming p-type semiconducting chalcogenide nano-particles and a metal capable of forming n-type semiconducting chalcogenide nano-particles, wherein at least one of said metal chalcogenides has a band-gap between 1.0 and 2.9 eV and the concentration of said metal capable of forming p-type semiconducting chalcogenide nano-particles is at least 5 atomic percent of said metal and is less than 50 atomic percent of said metal, and wherein said metal capable of forming p-type semiconducting chalcogenide nano-particles is selected from the group consisting of copper, chromium, iron and nickel.

13. The metal chalcogenide composite nano-particle according to claim 12, wherein said metal chalcogenide composite nano-particle comprises a p-type semiconducting metal chalcogenide phase and a n-type semiconducting chalcogenide phase, and wherein the concentration of said p-type semiconducting metal chalcogenide in said metal chalcogenide composite nano-particle is at least 5 mole percent and is less than 50 mole percent.

14. The metal chalcogenide composite nano-particle according to claim 12, wherein said metal chalcogenide composite particle is a coprecipitated particle.

15. The metal chalcogenide composite nano-particle according to claim 12, wherein said metal chalcogenide composite particle is a metal sulphide composite particle.

16. The metal chalcogenide composite nano-particle according to claim 12, wherein said metal capable of forming n-type semiconducting chalcogenide nano-particles is selected from the group consisting of zinc, bismuth, cadmium, mercury, indium, tin, tantalum and titanium.

17. The metal chalcogenide composite nano-particle according to claim 16, wherein said metal chalcogenide composite particle further comprises a metal capable of forming spectrally sensitizing chalcogenide nano-particles with a band-gap between 1.0 and 2.9 eV, and wherein said metal capable of forming spectrally sensitizing chalcogenide nano-particles is selected from the group consisting of silver, lead, copper, bismuth, vanadium and cadmium.

18. The metal chalcogenide composite nano-particle according to claim 12, wherein said metal chalcogenide composite particle further comprises a metal capable of forming spectrally sensitizing chalcogenide nano-particles with a band-gap between 1.0 and 2.9 eV.

19. The metal chalcogenide composite nano-particle according to claim 18, wherein said metal capable of forming spectrally sensitizing chalcogenide nano-particles is selected from the group consisting of silver, lead, copper, bismuth, vanadium and cadmium.

20. A metal chalcogenide composite nano-particle comprising a metal capable of forming p-type semiconducting chalcogenide nano-particles and a metal capable of forming n-type semiconducting chalcogenide nano-particles, wherein at least one of said metal chalcogenides has a band-gap between 1.0 and 2.9 eV and the concentration of said metal capable of forming p-type semiconducting chalcogenide nano-particles is at least 5 atomic percent of said metal and is less than 50 atomic percent of said metal, wherein said metal capable of forming n-type semiconducting chalcogenide nano-particles is selected from the group consisting of zinc, bismuth, indium, tin, tantalum and titanium, wherein said metal capable of forming p-type semiconducting chalcogenide nano-particles is selected from the group consisting of copper, chromium, iron, lead and nickel, wherein said metal chalcogenide composite particle further comprises a metal capable of forming spectrally sensitizing chalcogenide nano-particles with a band-gap between 1.0 and 2.9 eV, and wherein said metal capable of forming spectrally sensitizing chalcogenide nano-particles is selected from the group consisting of silver, lead, copper, bismuth, vanadium and cadmium.

21. A dispersion comprising a metal chalcogenide composite nano-particle comprising a metal capable of forming p-type semiconducting chalcogenide nano-particles and a metal capable of forming n-type semiconducting chalcogenide nano-particles, wherein at least one of said metal chalcogenides has a band-gap between 1.0 and 2.9 eV and the concentration of said metal capable of forming p-type semiconducting chalcogenide nano-particles is at least 5 atomic percent of said metal and is less than 50 atomic percent of said metal.

22. A layer comprising metal chalcogenide composite nano-particles comprising a metal capable of forming p-type semiconducting chalcogenide nano-particles and a metal capable of forming n-type semiconducting chalcogenide nano-particles, wherein at least one of said metal chalcogenides has a band-gap between 1.0 and 2.9 eV and the concentration of said metal capable of forming p-type semiconducting chalcogenide nano-particles is at least 5 atomic percent of said metal and is less than 50 atomic percent of said metal.

23. The layer according to claim 22, wherein said layer further contains at least one spectral sensitizer for said metal chalcogenide composite nano-particles.

24. The layer according to claim 23, wherein said at least one spectral sensitizer is selected from the group consisting of metal chalcogenide nano-particles with a band-gap between 1.0 and 2.9 eV, organic dyes, and metallo-organic dyes.

25. The layer according to claim 22, wherein said layer further comprises a binder.

26. The layer according to claim 25, wherein said binder is poly(vinyl pyrrolidone).

27. A photovoltaic device comprising a layer comprising metal chalcogenide composite nano-particles comprising a metal capable of forming p-type semiconducting chalcogenide nano-particles and a metal capable of forming n-type semiconducting chalcogenide nano-particles, wherein at least one of said metal chalcogenides has a band-gap between 1.0 and 2.9 eV and the concentration of said metal capable of forming p-type semiconducting chalcogenide nano-particles is at least 5 atomic percent of said metal and is less than 50 atomic percent of said metal.

* * * * *